United States Patent [19]
Kozuka et al.

[11] Patent Number: 5,861,655
[45] Date of Patent: Jan. 19, 1999

[54] PHOTOELECTRIC CONVERSION APPARATUS AND IMAGE READING APPARATUS WITH GOOD CROSSTALK CHARACTERISTICS

[75] Inventors: Hiraku Kozuka, Hiratsuka; Shigetoshi Sugawa, Atsugi, both of Japan

[73] Assignee: Canon Kabushiki Kaisha, Tokyo, Japan

[21] Appl. No.: 783,358

[22] Filed: Jan. 16, 1997

[30] Foreign Application Priority Data

Jan. 22, 1996 [JP] Japan .................................. 8-008202

[51] Int. Cl.⁶ ...................... H01L 31/042; H01L 31/0232
[52] U.S. Cl. ........................... 257/446; 257/435; 257/465
[58] Field of Search ................................. 257/443, 446, 257/461, 465, 629, 652, 435

[56] References Cited

U.S. PATENT DOCUMENTS

| | | | |
|---|---|---|---|
| 4,794,443 | 12/1988 | Tanaka et al. ............................. | 357/43 |
| 4,814,846 | 3/1989 | Matsumuto et al. ...................... | 357/30 |
| 5,106,765 | 4/1992 | Mizutani et al. .......................... | 437/31 |
| 5,268,309 | 12/1993 | Mizutani et al. .......................... | 437/3 |
| 5,309,013 | 5/1994 | Suzuki et al. ............................. | 257/446 |
| 5,481,124 | 1/1996 | Kozuka et al. ........................... | 257/185 |
| 5,567,974 | 10/1996 | Yoshitake et al. ....................... | 257/446 |

FOREIGN PATENT DOCUMENTS

| | | |
|---|---|---|
| 54-146681 | 11/1979 | Japan . |
| 646547 | 1/1982 | Japan . |

*Primary Examiner*—Gene M. Munson
*Attorney, Agent, or Firm*—Fitzpatrick, Cella, Harper & Scinto

[57] ABSTRACT

A photoelectric conversion apparatus has an element separation structure that is adequate as to crosstalk between pixels and excellent in FPN characteristics. The photoelectric conversion apparatus comprises a semiconductor substrate of a first conduction type, a plurality of first semiconductor regions formed in a surface of the semiconductor substrate and having the opposite conduction type to that of the substrate, a second semiconductor region having the same conduction type as the first semiconductor regions and disposed between the plurality of first semiconductor regions thus formed, and a third semiconductor region disposed between the first and second semiconductor regions having the first conduction type, and having an impurity concentration higher than that of the semiconductor substrate.

19 Claims, 9 Drawing Sheets

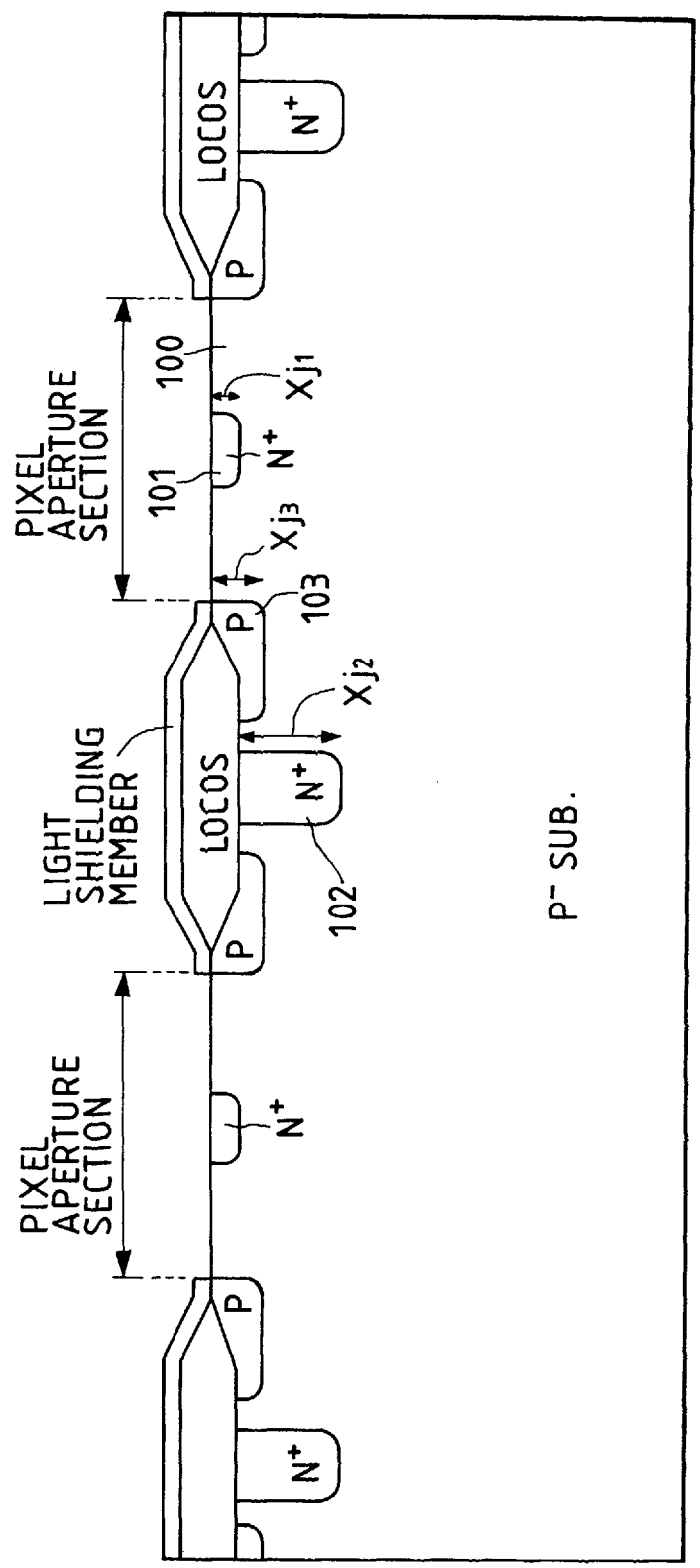

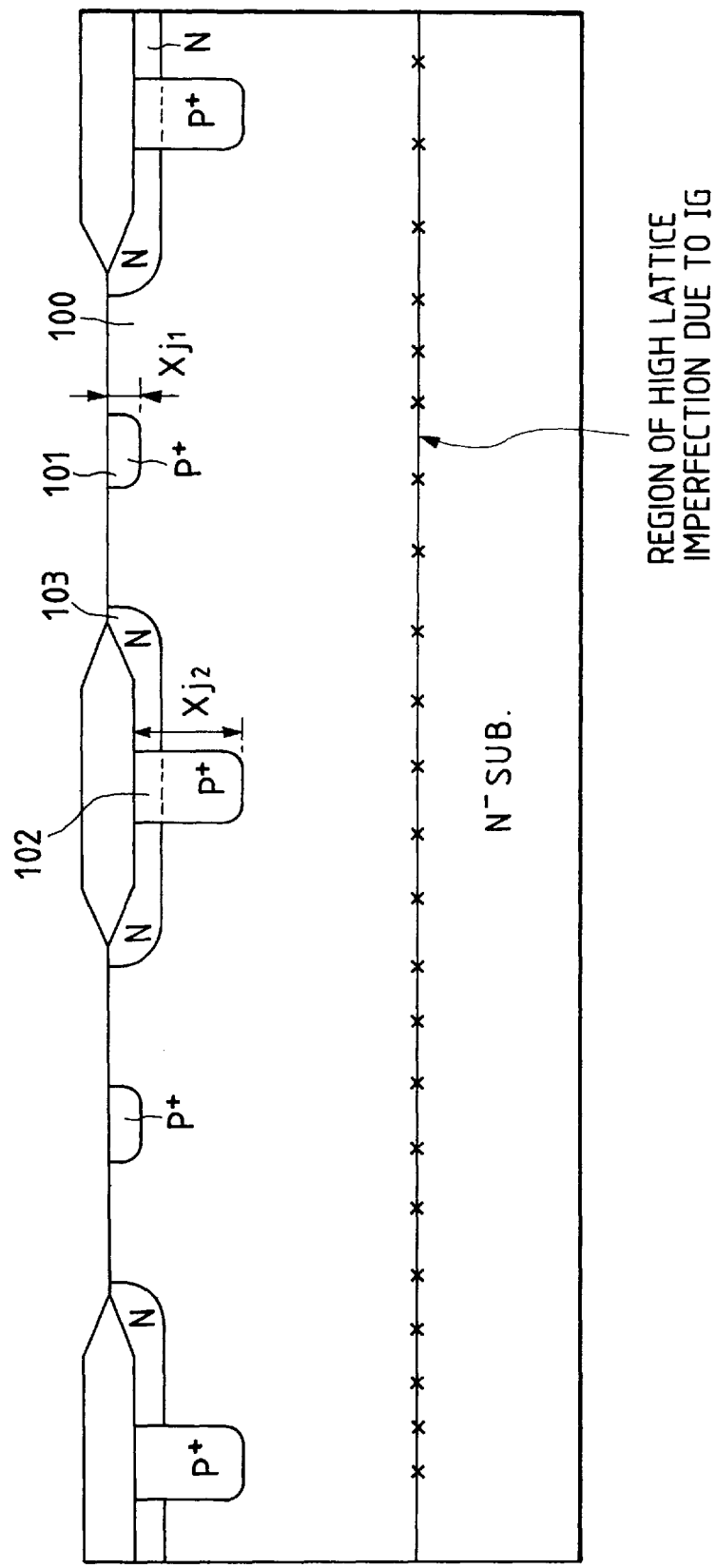

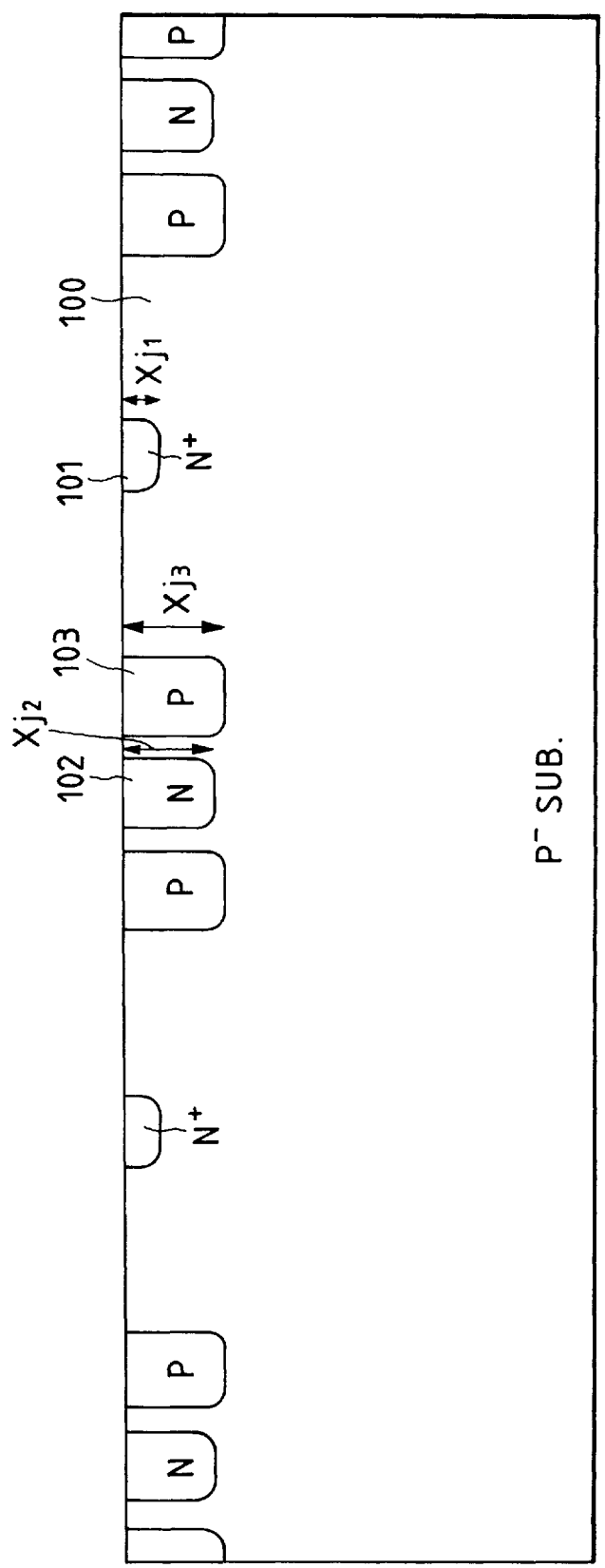

PHOTOELECTRIC CONVERSION APPARATUS AND IMAGE READING APPARATUS WITH GOOD CROSSTALK CHARACTERISTICS

BACKGROUND OF THE INVENTION

1. Field of the Invention

The present invention relates to one-dimensional or two-dimensional photoelectric conversion apparatus and image reading apparatus used in facsimile machines, digital copiers, X-ray image pickup apparatus, or the like, and more particularly, the invention concerns an element separation structure used therein.

2. Related Background Art

A reading system using a reduction optical system and a CCD type sensor has been used heretofore as a reading system in facsimile machines, digital copiers, X-ray image pickup apparatus, or the like, but with the development of photoelectric conversion semiconductor materials typified by hydrogenated amorphous silicon (hereinafter referred to as a-Si), recent development is remarkable in so-called contact type sensors in which photoelectric conversion elements and signal processing sections are formed in a large-area substrate and which is arranged to read information on an information source using an optical system of magnification of unity.

FIGS. 7A to 7C are cross-sectional views to show structures of conventional photoelectric conversion apparatus as disclosed in Japanese Laid-open Patent Application No. 54-146681.

FIG. 7A shows a cross-section of an array composed of two elements, in which reference numeral 1 designates an n$^+$ type Si substrate, 2 a high-resistance n$^-$ layer, 3 a plurality of isolated zones of p$^+$ layer, and 4 electrodes. As shown in the drawing, the apparatus is normally reverse-biased, and load resistors $R_1$, $R_2$ are connected between the p-type electrodes 4 and a bias power supply. Among carrier pairs occurring near the border between the two elements, holes are attracted to the p$^+$ zone 3 by an electric field, but some of them also flow into the adjacent element because of diffusion due to concentration gradient, thereby causing crosstalk. This did not allow the distance between elements to be decreased to below several tens of μm.

FIG. 7B is a cross-sectional view to show another conventional example, in which reference numeral 21 designates a high-concentration n$^+$ type silicon substrate, 22 a high-resistance and low-concentration n$^-$ silicon layer having the same conduction type as the substrate does, and 23, 24 a plurality of p$^+$ type regions of the opposite conduction type to that of the n$^-$ layer 22, which are separated from each other, thus forming a plurality of elements (photosensor elements) 25, 26 in p-n$^-$-n$^+$ structure. Further, numeral 27 denotes a high-concentration n$^+$ region formed relatively deeply, and 28, 29 low-concentration p$^-$ regions formed relatively shallowly.

In the elements of this structure, curved lines indicated by dotted lines in the n$^-$ layer 22 indicate the electric field. Horizontal components of the electric field prevent the carrier pairs occurring near the border between the p$^+$ regions 23, 24 with reception of incident light from diffusing to the adjacent element as the holes are subject to drift to the p$^+$ regions 23 or 24 of the element 25 or 26 which has received the incident light. The holes near the n$^+$ layer 27 at the border and near the border with the substrate 21 also tend to be separated by the horizontal components of the electric field.

FIG. 7C shows an example in which the n$^+$ region 27, shown in FIG. 7B, is formed still more deeply down the surface of the substrate 21. When a part of the field is connected with the substrate 21 through the n$^+$ layer 27 in this way, element separation becomes better.

FIG. 8 is a schematic cross-sectional view to show the structure of a semiconductor photodetector as another conventional example disclosed in Japanese Patent Publication No. 64-6547.

In the drawing, an n$^-$ layer 72 is epitaxially grown, for example, on a p$^+$ type semiconductor layer 71 which serves as a substrate, and between p$^+$ layer 73 and n$^+$ layer 74 there is provided a p$^-$ layer 70 having an impurity concentration higher than that of the n$^-$ layer 72 and not higher than one fifth of that of the p$^+$ layer 73.

Numerals 75, 76, 77 denote electrode leads, and reverse bias $V_e$ is placed through the electrode leads 75, 77 between the n$^+$ layer 74 and the p$^+$ layer 71 which is the substrate, thereby forming respective diodes.

Under such bias setting, the carriers (electrons) diffusing horizontally go into the n$^+$ layer 74 to recombine therewith, thereby obtaining photodiodes in an array structure nearly perfect in signal separation between the elements and very low in crosstalk.

However, in the cases where, in the substrate with plural photosensor elements formed therein, element separation is effected by the semiconductor regions of the same conduction type as that of substrate in order to collect the horizontally diffusing holes as described in the above conventional examples, there is a problem to be solved in that crosstalk characteristics between elements are still inadequate.

There is another problem, that injected carriers from a peripheral circuit system to the substrate become false signals, which facilitates degradation of characteristics in FPN (Fixed Pattern Noise).

SUMMARY OF THE INVENTION

An object of the present invention is to realize a photoelectric conversion apparatus having element separation structure with adequate crosstalk characteristics between pixels and with excellent FPN characteristics.

Another object of the present invention is to provide a photoelectric conversion apparatus comprising:

a semiconductor substrate of a first conduction type;

a plurality of first semiconductor regions formed in a surface of the semiconductor substrate and having the opposite conduction type to that of the substrate;

a second semiconductor region having the same conduction type as the first semiconductor regions and disposed between the first semiconductor regions; and a third semiconductor region disposed between the first and second semiconductor regions, having the first conduction type, and having an impurity concentration higher than that of the semiconductor substrate.

According to the present invention, the pixel separation region of the opposite conduction type to that of the substrate is formed as a sink of carriers between pixels so as to capture unnecessary carriers, whereby crosstalk can be decreased.

In addition, the third semiconductor region can suppress parasitic bipolar operation.

BRIEF DESCRIPTION OF THE DRAWINGS

FIGS. 1A and 1B are a schematic cross-sectional view and a plan view, respectively, to show the configuration of a photoelectric conversion apparatus in the first embodiment of the present invention;

FIG. 2 is a schematic cross-sectional view to show the configuration of a photoelectric conversion apparatus in the second embodiment of the present invention;

FIG. 5 is a schematic cross-sectional view to show the configuration of a photoelectric conversion apparatus in the fifth embodiment of the present invention;

DETAILED DESCRIPTION OF THE PREFERRED EMBODIMENTS

Figure 1B:
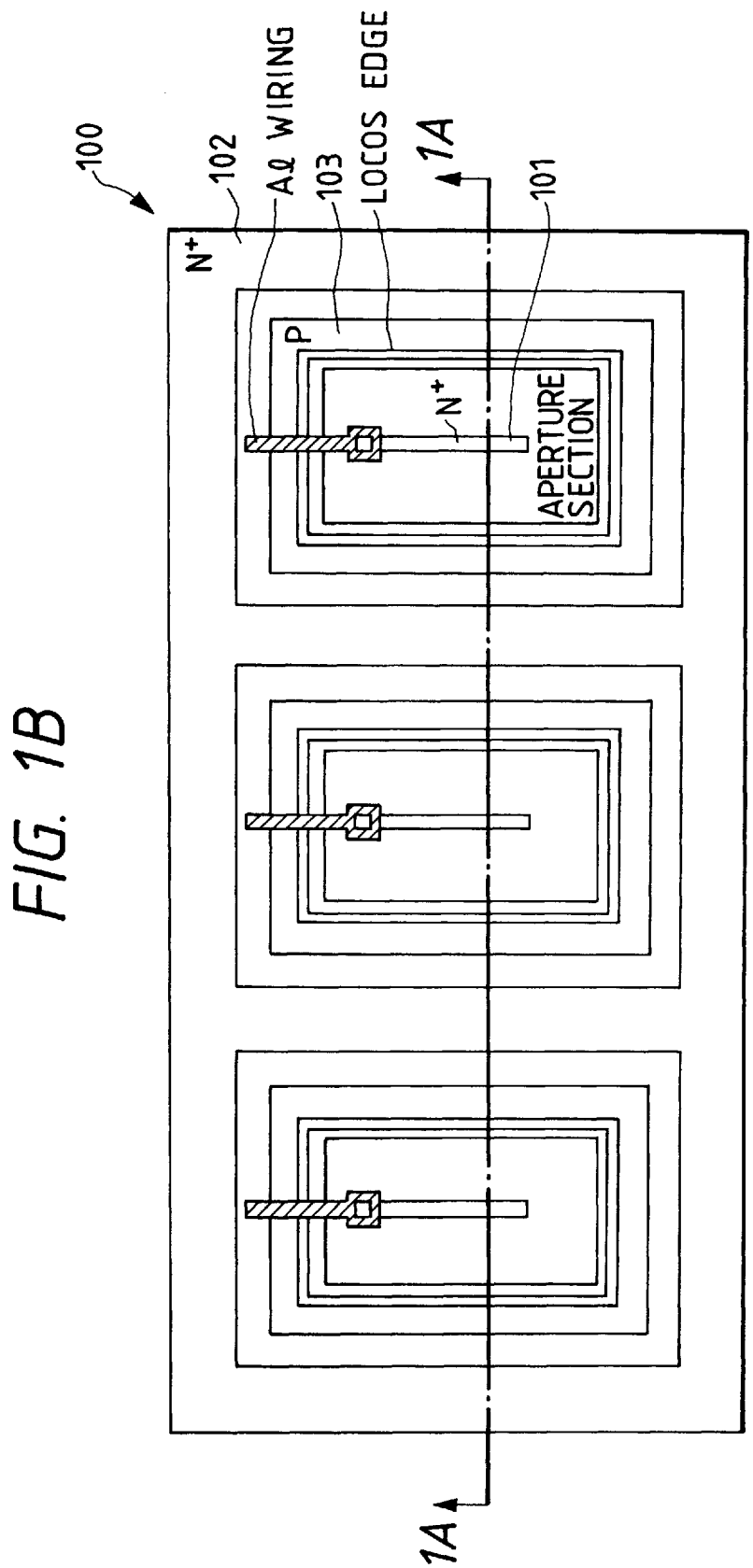

FIGS. 1A and 1B are drawings to show an embodiment of the photoelectric conversion apparatus of the present invention, wherein FIG. 1B is a schematic plan view and FIG. 1A is a schematic cross-sectional view thereof.

In the drawings, numeral 100 designates a semiconductor substrate of a first conduction type, numeral 101 a plurality of first semiconductor regions formed in the surface of the semiconductor substrate 100 and having the opposite conduction type to that of the substrate 100, numeral 102 a second semiconductor region having the same conduction type as the first semiconductor regions 101 and disposed between the plural first semiconductor regions 101 thus formed, and numeral 103 a third semiconductor region disposed between the first and second semiconductor regions, having the first conduction type, and having an impurity concentration higher than that of the semiconductor substrate 100.

For the semiconductor substrate used in the present invention, the impurity concentration is preferably between $1 \times 10^{14}$ and $1 \times 10^{16}$, both inclusive, and the substrate is more preferably one subjected to intrinsic gettering or extrinsic gettering.

The first semiconductor regions 101 form photodiodes as photoelectric conversion elements by the pn junction between the first semiconductor regions 101 and the substrate 100, the impurity concentration thereof is preferably between $1 \times 10^{18}$ and $1 \times 10^{21}$, both inclusive, and the junction depth thereof $Xj_1$ is preferably between 0.1 $\mu$m and 1 $\mu$m, both inclusive.

The second semiconductor region 102 has a role as a sink of electrons that are unnecessary photocarriers, the impurity concentration thereof is preferably between $1 \times 10^{16}$ and $1 \times 10^{20}$, both inclusive, and the junction depth thereof $Xj_2$ is preferably between 3 $\mu$m and 10 $\mu$m both inclusive. The junction depth $Xj_2$ is deeper than the first semiconductor regions, and the greater the junction depth $Xj_2$, the higher the crosstalk reducing effect.

Further, the second semiconductor region 102 has a potential fixing means to be kept at the same potential as the substrate or to be reversely biased. The potential fixing means includes an electrode or wiring connected to the second semiconductor region.

The third semiconductor region 103 has a role to decrease the current amplification factor β of the parasitic bipolar transistor formed by the first semiconductor region/substrate/second semiconductor region. The impurity concentration of the third semiconductor region 103 is greater than that of the substrate 100. It is determined so as to show sufficient withstand voltage upon application of bias, with respect to the second semiconductor region 102. The impurity concentration thereof is preferably between $1 \times 10^{15}$ and $1 \times 10^{17}$ both inclusive, the junction depth thereof $Xj_3$ is preferably between 1 $\mu$m and 10 $\mu$m, both inclusive, and the junction depth $Xj_3$ is preferably deeper than the first semiconductor regions 101.

Between the third semiconductor region 103 and the first semiconductor region 101 there is a portion of the semiconductor substrate 100 exposed from the field insulating film. If dark current is non-negligible, an impurity region having an impurity concentration (preferably between $1 \times 10^{16}$ and $1 \times 10^{18}$, both inclusive) higher than that of the substrate and having the same conduction type as the substrate does can be formed over the surface of the substrate between the third semiconductor region and the first semiconductor region.

The substrate applicable in present invention is preferably selected from the semiconductors such as Si, Ge, III–V compounds, II–VI compounds, and the like. Particularly, a desired substrate is a semiconductor wafer itself or an Si substrate epitaxially grown on the semiconductor wafer. In the cases wherein the epitaxially grown region has a different conduction type from that of the base substrate, the conduction type of the substrate stated in the present invention means the conduction type of the epitaxially grown region. This is because the epitaxially grown region becomes the anode or cathode of the photodiode.

It is clear that the conduction types in FIG. 1A may be reversed, and the thick insulating film (field insulating film) for defining pixel aperture sections is not essential, but may be provided as occasion demands.

Further, it is preferred to provide a light shielding member for shielding the second and third semiconductor regions.

The example of FIG. 1B shows a one-dimensional line sensor, but an area sensor may be constructed by arranging pixels in a two-dimensional matrix.

FIGS. 1A and 1B omit illustration of a passivation film covering the surface of substrate and illustration of wiring.

[First Embodiment]

The configuration of the photoelectric conversion apparatus according to the first embodiment of the present invention is the same as that shown in FIGS. 1A and 1B.

In this example the impurity concentrations and junction depths of the substrate and respective regions were determined as shown in the drawing: for the substrate 100 the impurity concentration was $1 \times 10^{15}/cm^3$; for the first semiconductor regions 101 the impurity concentration was $1 \times 10^{20}$ and the depth was 0.3 $\mu$m; for the second semiconductor region 102 the impurity concentration was $5 \times 10^{18}/cm^3$ and the depth was 7 $\mu$m; for the third semiconductor region 103 the impurity concentration was $5 \times 10^{16}/cm^3$ and the depth was 4 $\mu$m.

An LOCOS region being the thick insulating region is formed by selective oxidation on each pixel separation area and a layer of a light shielding material is provided thereon.

FIG. 1B is a schematic plan view of the photoelectric conversion apparatus having a plurality of pixels, and, as shown in the drawing, a first semiconductor region 101 on the substrate 100 is surrounded by the second semiconductor region 102 and third semiconductor region 103.

Al wiring is connected to the second semiconductor region 102 and reference voltage supply is connected to the Al wiring, though not shown in the cross-sectional view of FIG. 1A. In this case, the reference voltage supply provides a positive voltage.

The element separation structure of the present invention was applied to the photoelectric conversion apparatus and at the pixel pitch equivalent to 400 dpi, crosstalk between adjacent pixels was 0.1% or less. Further, the regions 103 may be provided with an electrode to keep the regions 103 at a predetermined reference potential.

[Second Embodiment]

FIG. 2 is a schematic cross-sectional view to show the configuration of the second embodiment of the present invention.

In the drawing, numeral 100 designates a substrate of an n⁻ type semiconductor, 101 a first semiconductor region of p⁺ type, 102 a second semiconductor region of p⁺ type, and 103 a third semiconductor region of n type.

A feature of the present embodiment is a high lattice imperfection region formed in the substrate 100 by IG (Intrinsic Gettering). Such microimperfections or strains existing inside the substrate have as a function to capture or fix impurities which would otherwise exert a harmful influence on the element characteristics or to remove point defects associated with defect occurrence. By this function, element-forming regions in the surface of substrate are cleaned and are made defectless upon formation of the element, thereby improving the element characteristics and yield. In addition, a combination of the function with the structure of the present invention can present the carriers, which could be a cause of false signals, injected from the peripheral circuit system to the substrate from diffusing into the light-receiving portions, thereby further improving the FPN characteristics.

[Third Embodiment]

Figure 3:
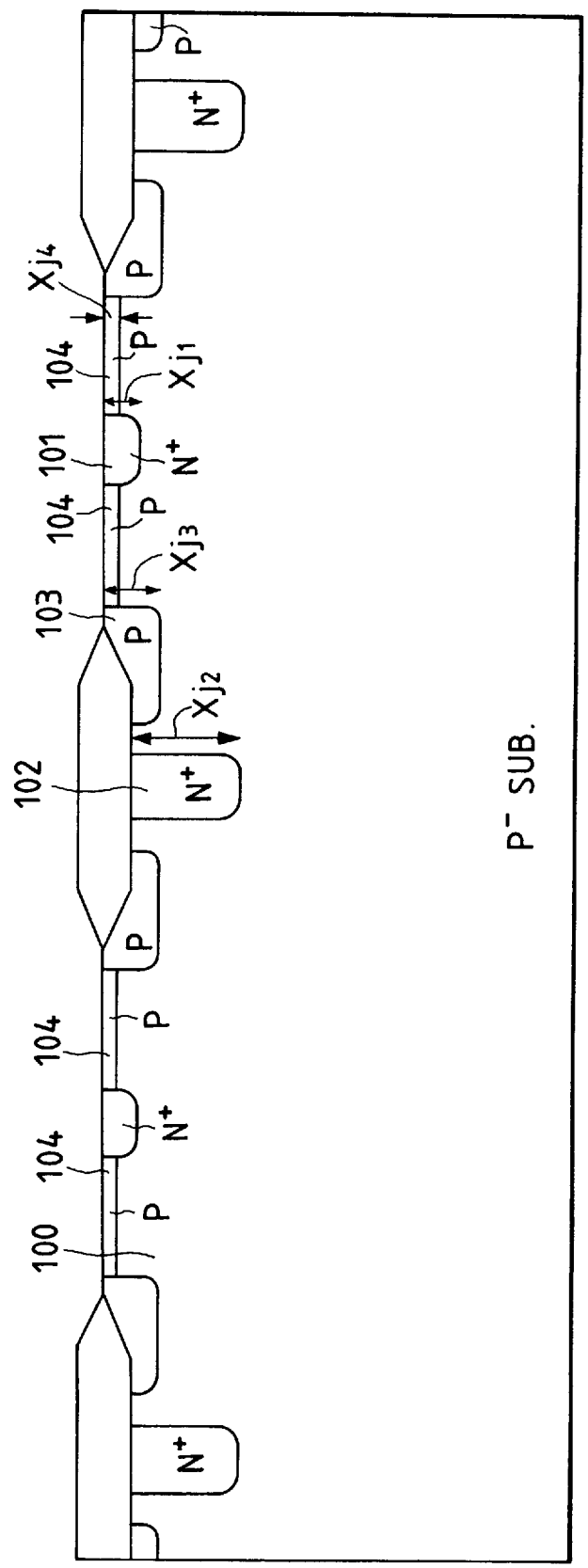
FIG. 3 is a schematic cross-sectional view to show the configuration of a photoelectric conversion apparatus in the third embodiment of the present invention.

FIG. 3 is a schematic cross-sectional view to show the configuration of the third embodiment of the present invention.

In the drawing, numeral 100 designates a substrate of a p⁻ type semiconductor, 101 a first semiconductor region of n⁺ type, 102 a second semiconductor region of n⁺ type, and 103 a third semiconductor region of p type.

The impurity concentrations and junction depths of the substrate and respective regions were determined as shown in the drawing.

A feature of the present embodiment is that an impurity region 104 having an impurity concentration (between $1 \times 10^{16}$ and $1 \times 10^{18}$, both inclusive) and having the same conduction type as that of the substrate is formed in a portion of the semiconductor substrate exposed from the thick insulating film (though the exposed portion is actually covered by an insulating film) between the third semiconductor region and the first semiconductor region.

In the cases where the dark current occurring in the surface of substrate is non-negligible, a the configuration as in the present embodiment may be applied.

[Fourth Embodiment]

Figure 4:
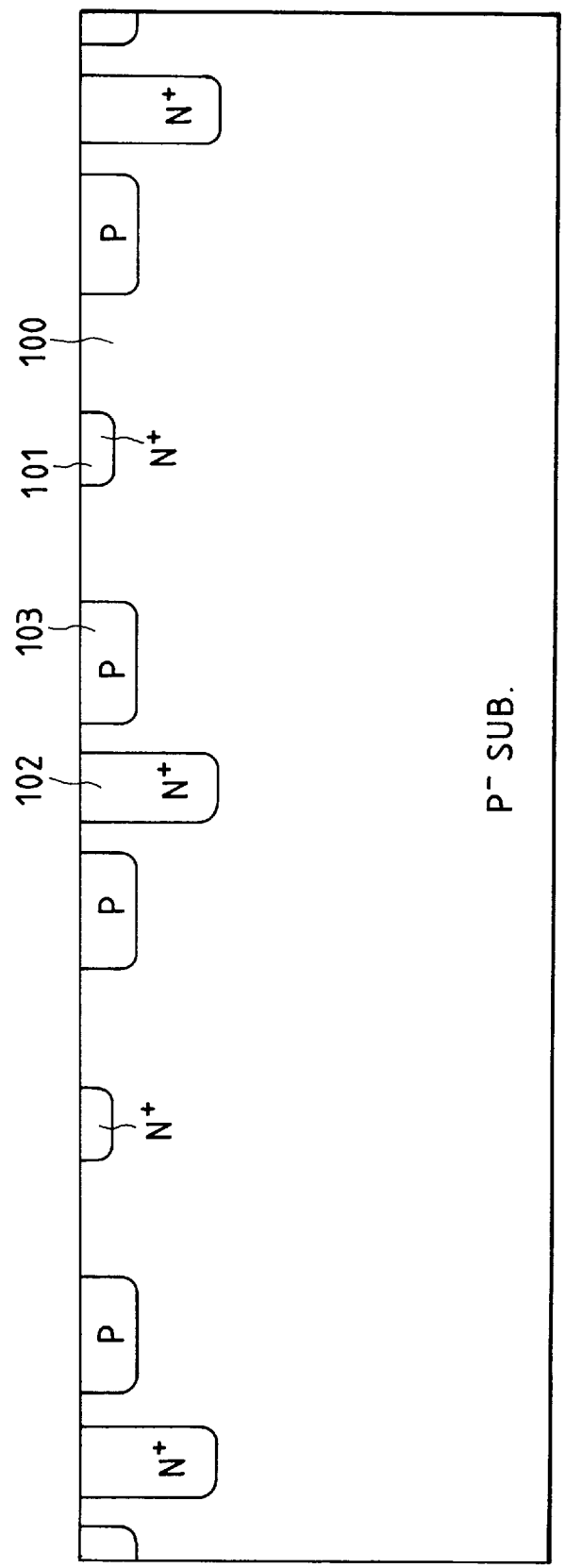
FIG. 4 is a schematic cross-sectional view to show the configuration of a photoelectric conversion apparatus in the fourth embodiment of the present invention.

FIG. 4 is a schematic cross-sectional view to show the configuration of the fourth embodiment of the present invention.

In the drawing, numeral 100 designates a substrate of a p⁻ type semiconductor, 101 a first semiconductor region of n⁺ type, 102 a second semiconductor region of n⁺ type, and 103 a third semiconductor region of p type.

A feature of the present embodiment is that the surface of the semiconductor substrate having the elements is flat without forming the LOCOS regions being the thick field insulating film on the pixel separation regions.

The pixel separation structure of the present invention can reduce crosstalk as effecting sufficient pixel separation without providing such regions.

[Fifth Embodiment]

FIG. 5 is a schematic cross-sectional view to show the configuration of the fifth embodiment of the present invention.

In the drawing, numeral 100 designates a substrate of a p⁻ type semiconductor, 101 a first semiconductor region of n⁺ type, 102 a second semiconductor region of n type, and 103 a third semiconductor region of p type.

The impurity concentrations and junction depths of the substrate and respective regions were determined as shown in the drawing.

A feature of the present embodiment is that the junction depth $Xj_3$ of the third semiconductor region is greater or deeper than the junction depth $Xj_2$ of the second semiconductor region.

This structure can also achieve sufficient pixel separation and decrease crosstalk similarly.

[Sixth Embodiment]

Figure 6A:
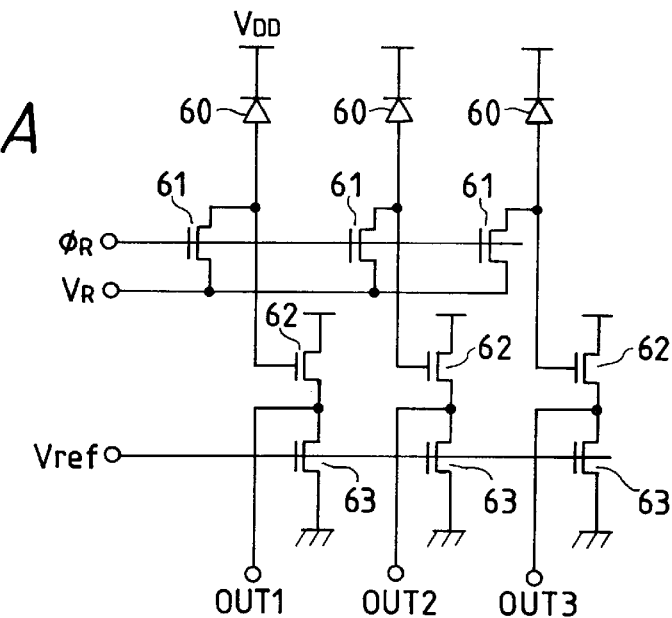
FIG. 6A is a circuit diagram to show the configuration of an image reading apparatus in the sixth embodiment of the present invention.
Figure 6B:
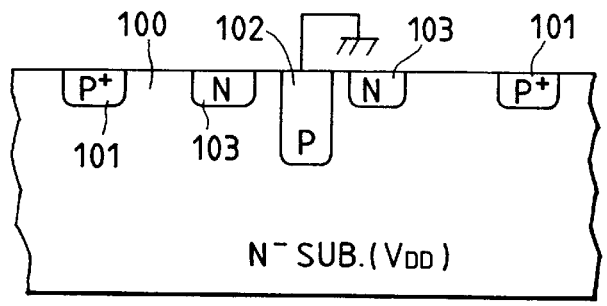
FIGS. 6B and 6C are schematic cross-sectional views thereof.
Figure 6C:
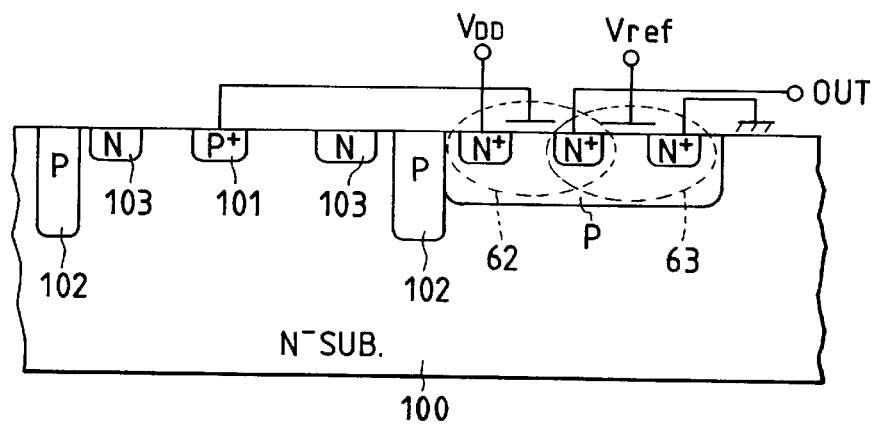
Figure 7A:
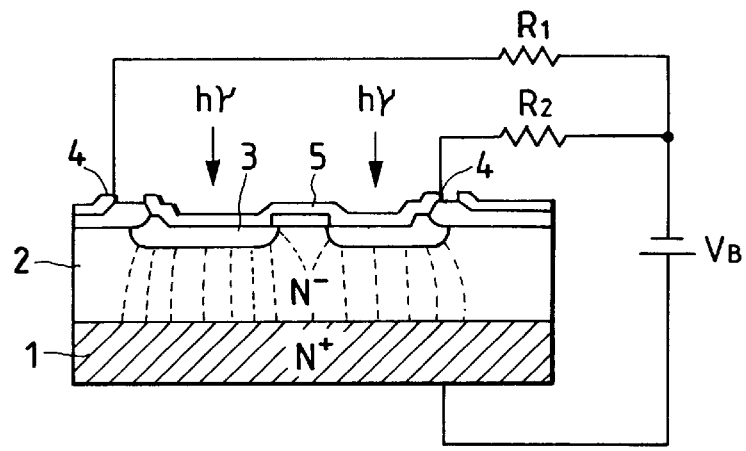
FIGS. 7A, 7B and 7C are schematic cross-sectional views to show the configuration of photoelectric conversion apparatus in conventional examples.
Figure 7B:
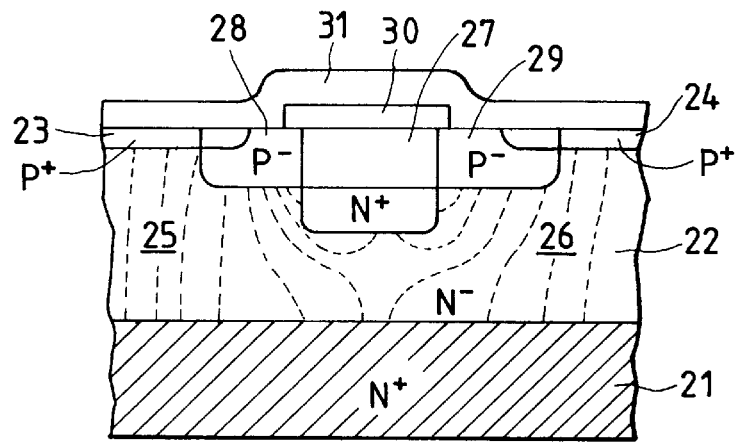
Figure 7C:
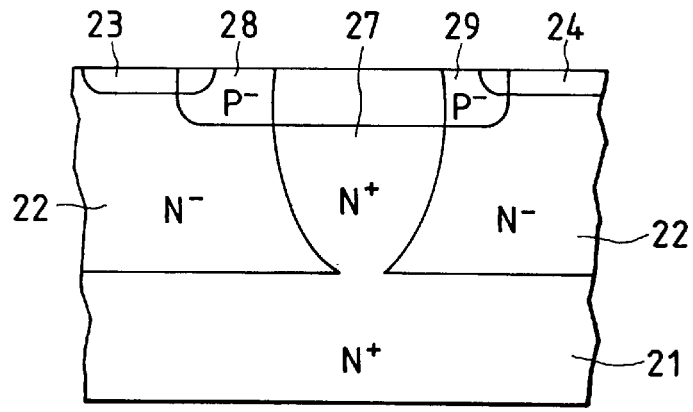
Figure 8:
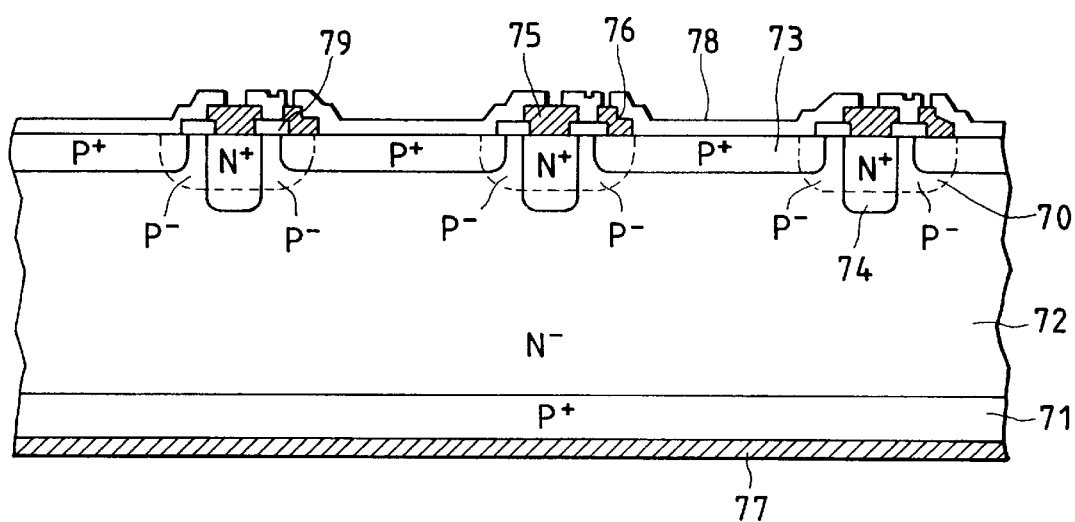
FIG. 8 is a schematic cross-sectional view to show the configuration of a photoelectric conversion apparatus in another conventional example.

FIGS. 6A to 6C are drawings to show the configuration of photoelectric conversion elements according to the sixth embodiment of the present invention.

FIG. 6A is a circuit diagram to show the elements for three pixels. Numeral 60 designates photosensor photodiodes, 61 MOS transistors for sensor reset, and both 62 and 63 MOS transistors, forming source follower amplifiers. As each transistor 61, 62, 63 is kept off, photocarrier holes are accumulated in the anode of photodiode 60. A light signal amplified by the transistor 62 is output to an output line OUT 1 to OUT 3. After that, the transistors 61, 63 are turned on, whereby the photodiode 60 and transistor 62 are reset to the initial state. This operation is repeated.

In FIG. 6B, similarly as in the embodiments described above, numeral 100 designates the substrate, 101 the first semiconductor regions, 102 the second semiconductor region, and 103 the third semiconductor region.

FIG. 6A is a circuit diagram to show a line sensor or an area sensor provided with a plurality of pixels arranged in the pixel separation structure of the present invention shown in FIG. 6B. A photodiode as a photoelectric conversion element is placed in each pixel surrounded by the pixel separation structure.

FIG. 6C shows the schematic cross-sectional structure of one pixel part of FIG. 6A. However, the reset MOS transistor of 61 is omitted from FIG. 6C.

An image reading apparatus is constructed by combining an IC chip including signal processing circuits connected to the respective output lines OUT 1 to OUT 3 with a light source for illuminating an original carrying an image to be read.

As described above, the present invention involves forming the pixel separation regions of the opposite conduction type to that of the substrate between pixels, as a sink of carriers to capture unnecessary carriers, thereby reducing crosstalk.

The third semiconductor region can suppress the parasitic bipolar operation.

Therefore, the present invention can realize the photoelectric conversion apparatus having the element separation structure sufficient in crosstalk characteristics between pixels and excellent in FPN characteristics.

What is claimed is:

1. A photoelectric conversion apparatus comprising:
a semiconductor substrate of a first conduction type;
a plurality of first semiconductor regions formed in a surface of said semiconductor substrate and having a conduction type opposite to that of said substrate;
a second semiconductor region having the same conduction type as said first semiconductor regions and disposed between said plurality of first semiconductor regions thus formed; and
a third semiconductor region disposed between said first and second semiconductor regions, having the first conduction type, and having an impurity concentration higher than that of said semiconductor substrate,
wherein said first semiconductor regions are surrounded by said second semiconductor region and third semiconductor region, and
wherein said first semiconductor region and said third semiconductor region are separated mutually, and at least one of (1) a light shielding member and (2) a thick insulating region is provided on said second semiconductor region and said third semiconductor region.

2. A photoelectric conversion apparatus according to claim 1, wherein a potential of said second semiconductor region is fixed at a same potential as that of said substrate or at a reverse bias potential to that of said substrate.

3. A photoelectric conversion apparatus according to claim 1, wherein a junction depth $Xj_1$ of said first semiconductor regions and a junction depth $Xj_2$ of said second semiconductor region are in the relation of $Xj_1 < Xj_2$.

4. A photoelectric conversion apparatus according to claim 1, wherein said substrate has a high lattice imperfection region.

5. A photoelectric conversion apparatus according to claim 1, wherein an impurity region having an impurity concentration higher than that of said substrate and having the same conduction type as said substrate is formed over the surface of said substrate between said third semiconductor region and said first semiconductor region.

6. A photoelectric conversion apparatus according to claim 1, wherein the surface of the semiconductor substrate in which elements are provided is a flat surface.

7. A photoelectric conversion apparatus according to claim 1, wherein a junction depth $Xj_1$ of said first semiconductor regions, a junction depth $Xj_2$ of said second semiconductor region, and a junction depth $Xj_3$ of said third semiconductor region are in the following relation:

$$Xj_1 < Xj_2 \text{ and } Xj_3 > Xj_2.$$

8. An apparatus according to claim 1, having an amplifying transistor for each first semiconductor region outside the region surrounded by said second and third semiconductor regions.

9. An apparatus according to claim 8, further comprising a reset transistor outside said region.

10. An image reading apparatus having a plurality of photoelectric conversion apparatus arranged in a one-dimensional or two-dimensional array and scanning means, wherein each of said photoelectric conversion apparatus comprises:
a semiconductor substrate of a first conduction type;
a plurality of first semiconductor regions formed in a surface of said semiconductor substrate and having a conduction type opposite to that of said substrate;
a second semiconductor region having the same conduction type as said first semiconductor regions and disposed between said plurality of first semiconductor regions thus formed; and
a third semiconductor region disposed between said first and second semiconductor regions, having the first conduction type, and having an impurity concentration higher than that of said semiconductor substrate,
wherein said first semiconductor regions are surrounded by said second semiconductor region and third semiconductor region, and
wherein said first semiconductor region and said third semiconductor region are separated mutually, and at least one of (1) a light shielding member and (2) a thick insulating region is provided on said second semiconductor region and said third semiconductor region.

11. An image reading apparatus according to claim 10, wherein a potential of said second semiconductor region is fixed at a same potential as that of said substrate or at a reverse bias potential to that of said substrate.

12. An image reading apparatus according to claim 10, wherein a junction depth $Xj_1$ of said first semiconductor regions and a junction depth $Xj_2$ of said second semiconductor region are in the relation of $Xj_1 < Xj_2$.

13. An image reading apparatus according to claim 10, wherein said substrate has a high lattice imperfection region.

14. An image reading apparatus according to claim 10, wherein an impurity region having an impurity concentration higher than that of said substrate and having the same conduction type as said substrate is formed over the surface of said substrate between said third semiconductor region and said first semiconductor region.

15. An image reading apparatus according to claim 10, wherein the surface of the semiconductor substrate in which elements are provided is a flat surface.

16. An image reading apparatus according to claim 10, wherein a junction depth $Xj_1$ of said first semiconductor regions, a junction depth $Xj_2$ of said second semiconductor region, and a junction depth $Xj_3$ of said third semiconductor region are in the following relation:

$$Xj_1 < Xj_2 \text{ and } Xj_3 > Xj_2.$$

17. A photoelectric conversion apparatus, comprising:
a semiconductor substrate of a first conduction type;
a plurality of first semiconductor regions formed in a surface of said semiconductor substrate and having a conduction type opposite to that of said substrate;
a second semiconductor region having the same conduction type as said first semiconductor regions and disposed between said plurality of first semiconductor regions thus formed; and
a third semiconductor region disposed between said first and second semiconductor regions, having the first conduction type, and having an impurity concentration higher than that of said semiconductor substrate,
wherein said first semiconductor regions are surrounded by said second semiconductor region and third semiconductor region, and
circuits each of which comprises a photoelectric conversion element an anode or cathode of which is said first semiconductor region, a transistor for amplifying an output from said element, a first reset transistor for resetting an output line of said transistor, and a second reset transistor for resetting the anode or cathode of said element, wherein said circuits are arranged in an array.

18. An apparatus according to claim 17, wherein said amplifying transistor and said first and second reset transistors are MOS transistors.

19. An image reading apparatus having a photoelectric conversion apparatus and a light source for illuminating an original document, wherein said photoelectric conversion apparatus comprises:

a semiconductor substrate of a first conduction type;

a plurality of first semiconductor regions formed in a surface of said semiconductor substrate and having a conduction type opposite to that of said substrate;

a second semiconductor region having the same conduction type as said first semiconductor regions and disposed between said plurality of first semiconductor regions thus formed; and a third semiconductor region disposed between said first and second semiconductor regions, having the first conduction type, and having an impurity concentration higher than that of said semiconductor substrate, wherein said first semiconductor regions are surrounded by said second semiconductor region and third semiconductor region, and wherein said first semiconductor region and said third semiconductor region are separated mutually, and at least one of (1) a light shielding member and (2) a thick insulating region is provided on said second semiconductor region and said third semiconductor region.

* * * * *

UNITED STATES PATENT AND TRADEMARK OFFICE
CERTIFICATE OF CORRECTION

PATENT NO. : 5,861,655

DATED : January 19, 1999

INVENTOR(S): HIRAKU KOZUKA ET AL.

Page 1 of 2

It is certified that error appears in the above-identified patent and that said Letters Patent is hereby corrected as shown below:

Title page,
AT [56], REFERENCES CITED

Under Foreign Patent Documents

"646547 1/1982 Japan" should read --64-6547 2/1989 Japan--.

Under U.S. Patent Documents

"Matsumuto et al." should read --Matsumoto et al.--.

COLUMN 1

Line 29, "Laid-open" should read --Laid-Open--.

COLUMN 2

Line 27, "the" (first occurrence) should be deleted.

COLUMN 3

Line 64, "10 $\mu$m" should read --10 $\mu$m,--.

UNITED STATES PATENT AND TRADEMARK OFFICE
CERTIFICATE OF CORRECTION

PATENT NO. : 5,861,655
DATED : January 19, 1999
INVENTOR(S) : HIRAKU KOZUKA ET AL.

Page 2 of 2

It is certified that error appears in the above-identified patent and that said Letters Patent is hereby corrected as shown below:

COLUMN 4

Line 14, "$1 \times 10^{17}$" should read --$1 \times 10^{17}$,--.
Line 27, "in" should read --in the--.
Line 28, "the" should be deleted.
Line 30, "an" should read --a--.

COLUMN 5

Line 58, "the" should be deleted.

COLUMN 7

Line 45, "regions," should read --region,--.

Signed and Sealed this

Thirtieth Day of November, 1999

Attest:

Q. TODD DICKINSON

Attesting Officer

Acting Commissioner of Patents and Trademarks